(12) United States Patent
Wang et al.

(10) Patent No.: US 12,408,552 B1
(45) Date of Patent: Sep. 2, 2025

(54) GENERATION MODULE FOR DEEP GEOTHERMAL ENERGY AND ASSEMBLY METHOD THEREOF

(71) Applicant: Shenzhen University, Shenzhen (CN)

(72) Inventors: Jun Wang, Shenzhen (CN); Heping Xie, Shenzhen (CN); Xiting Long, Shenzhen (CN); Cunbao Li, Shenzhen (CN); Zhichao Liu, Shenzhen (CN); Licheng Sun, Shenzhen (CN); Jiaxi Liao, Shenzhen (CN); Zhou Deng, Shenzhen (CN)

(73) Assignee: Shenzhen University, Shenzhen (CN)

( * ) Notice: Subject to any disclaimer, the term of this patent is extended or adjusted under 35 U.S.C. 154(b) by 0 days.

(21) Appl. No.: 19/014,631

(22) Filed: Jan. 9, 2025

(30) Foreign Application Priority Data

May 22, 2024 (CN) .......................... 202410635386.7

(51) Int. Cl.
*H10N 10/17* (2023.01)
*F03G 4/00* (2006.01)

(52) U.S. Cl.
CPC ............ *H10N 10/17* (2023.02); *F03G 4/037* (2021.08)

(58) Field of Classification Search
None
See application file for complete search history.

(56) References Cited

U.S. PATENT DOCUMENTS

| 2009/0000309 A1* | 1/2009 | Hershberger | .......... H10N 10/13 62/3.5 |
| 2009/0205696 A1* | 8/2009 | Koester | .................. H10N 10/13 136/201 |
| 2016/0293821 A1* | 10/2016 | Ellison | .................. H10N 10/17 |

FOREIGN PATENT DOCUMENTS

| CN | 105978405 A | 9/2016 |
| CN | 107947639 A | 4/2018 |
| CN | 208971414 U | 6/2019 |

(Continued)

OTHER PUBLICATIONS

Remeli, Muhammad Fairuz et al., "Experimental investigation of combined heat recovery and power generation using a heat pipe assisted thermoelectric generator system," Energy Conversion and Management 111, pp. 147-157. (Year: 2016).*

(Continued)

*Primary Examiner* — Tamir Ayad
(74) *Attorney, Agent, or Firm* — Piloff Passino & Cosenza LLP; Rachel K. Piloff; Sean A. Passino

(57) ABSTRACT

A detachable geothermal in-situ thermovoltaic power generation module and an assembly method thereof are provided, including a heat pipe, with a cross section set as a regular polygon structure; a plurality of thermovoltaic power generation units sleeved on the heat pipe at intervals and arranged in series; each of the thermovoltaic power generation modules includes a housing, arranged at one side of the heat pipe, and a side of the housing facing the heat pipe is an open end; an electric heating block, arranged at one side of an inner cavity of the housing far from the open end; a (Continued)

framework, connected with an outer wall of the open end of the housing; the thermovoltaic power generation sheets are located between the framework and the electric heating block; the two hoops are respectively connected with the two ends of the housing, the hoops are sleeved on the heat pipe.

9 Claims, 9 Drawing Sheets

(56) References Cited

FOREIGN PATENT DOCUMENTS

| | | |
|---|---|---|
| CN | 214424641 U | 10/2021 |
| JP | 2016063206 A | 4/2016 |

OTHER PUBLICATIONS

Zhao, Yulong et al., "Experimental investigation of heat pipe thermoelectric generator," Energy Conversion and Management 252, 115123. (Year: 2022).*

Liu, Di et al., "Optimal design of thermoelectric cooling system integrated heat pipes for electric devices," Energy 128, pp. 403-413. (Year: 2017).*

Retrieval report dated Jun. 20, 2024 in SIPO application No. 202410635386.7.

Notification to Grant Patent Right for Invention dated Jun. 26, 2024 in SIPO application No. 202410635386.7.

* cited by examiner

GENERATION MODULE FOR DEEP GEOTHERMAL ENERGY AND ASSEMBLY METHOD THEREOF

CROSS-REFERENCE TO RELATED APPLICATIONS

This application claims priority to Chinese Patent Application No. 202410635386.7, filed on May 22, 2024, the contents of which are hereby incorporated by reference.

TECHNICAL FIELD

The disclosure relates to the geothermal in-situ thermovoltaic power generation technical field, and in particular to a detachable geothermal in-situ thermovoltaic power generation module and an assembly method thereof.

BACKGROUND

The development and utilization of geothermal energy is of great significance for adjusting energy structure, saving energy and reducing emissions. The existing geothermal power generation technology usually needs to pour water into the ground and take water as the medium to bring heat to the ground for subsequent power generation. However, problems such as thermal pollution and land subsidence are easy to occur in the work of water injection and extraction. Some scholars put forward the method of in-situ geothermal power generation. By placing the power generation system directly at the underground geothermal energy for power generation, the extraction of underground thermal energy in general geothermal power generation is eliminated, thus avoiding possible problems in the process of geothermal extraction.

Aiming at the development and utilization of deep geothermal energy, the deep geothermal in-situ power generation technology adopts temperature difference power generation technology to directly convert underground thermal energy into electric energy in situ. This technology realizes taking heat instead of water in the development of deep geothermal energy, and effectively reduces the problem of secondary disasters that may be caused by water intake. Although this technology has broad application prospects, it is necessary to build a large-scale power generation system so as to apply this technology in practical scenarios. In the process of large-scale system construction, using modular system components may effectively reduce the difficulty of building and improve the adaptability of the system to different application scenarios.

However, at present, the power and efficiency of deep geothermal in-situ power generation system using in-situ geothermal power generation mode are low, and the system has not yet reached the requirements of going from laboratory to site. In order to realize the transformation from laboratory to site, it is necessary to integrate the deep geothermal in-situ power generation system on a large scale and reduce the losses caused in the process. Therefore, a new thermoelectric module may be used to improve the bonding and fixing structure between heat source and heat pipe. A modular power generation test device was established in the laboratory, and the deep geothermal was simulated by electric heating, and the corresponding experimental test and optimization work were explored.

FIG. 8-FIG. 9 show a thermoelectric generator based on a thermal power plant, a system and a testing system thereof (with publication No. of CN 208971414 U). The thermoelectric generator has a positive-edge structure, and the heat in the waste residual steam of the thermal power plant passes through a tubular structure as a heat source, and the condensing system of the thermal power plant serves as a cold source, and each side of the tubular structure is a power generation unit; the pow generation unit includes a heat collector arranged in the tubular structure, a plurality of temperature difference power generation sheets arranged outside that tubular structure, a water circulation cooling system arranged outside the temperature difference power generation sheets, a plurality of temperature difference power generation sheets are connected in parallel and sequentially connected to a power supply parallel output circuit, the power supply parallel output circuit is connected with a voltage stabilizing circuit to stabilize the output voltage, and the water circulation cooling system is connected with a cold source and a voltage stabilizing circuit.

In the above system, the temperature difference power generation sheets are clamped and fixed by the groove on the wall of the heat transfer pipe and the cold source. However, this fixing method requires a special heat transfer pipe, which not only increases the processing difficulty, but also may affect the strength of the heat transfer pipe and cause potential safety hazards. In addition, because the heat transfer pipe is combined with the fixing groove of temperature difference power generation sheets, the number of temperature difference power generation sheets that may be arranged on the wall of the heat transfer pipe is limited by the size, position and number of fixing grooves, which is not conducive to diversified experimental tests. This formula of power generation unit assembly is also not conducive to practical large-scale application, so modularization of power generation unit may make the power generation unit more suitable for field application, and the suitable in-situ power generation system may be freely assembled according to the actual heat source situation.

To sum up, it is necessary to adopt a new assembly method of power generation unit to realize the independence of heat transfer pipe and power generation unit, so as to reduce the processing difficulty of heat transfer pipe, reduce the potential safety hazard, simplify the fixing method of power generation unit and improve the freedom of arrangement. The realization of kilowatt-level power generation through modularization of power generation unit may lay a foundation for subsequent field application.

SUMMARY

The disclosure aims to provide a detachable geothermal in-situ thermovoltaic power generation module and an assembly method thereof, so as to solve the problems existing in the prior art.

In order to achieve the above objective, the disclosure provides the following scheme: the disclosure provides a detachable geothermal in-situ thermovoltaic power generation module, including:

a heat pipe, with a cross section set as a regular polygon structure;

a plurality of thermovoltaic power generation units sleeved on the heat pipe at intervals and arranged in series;

where each of the thermovoltaic power generation units includes a plurality of thermovoltaic power generation modules, and a number of the plurality of thermovoltaic power generation units corresponds to a number of sides of the heat pipe;

each of the thermovoltaic power generation modules includes:
a housing, arranged at one side of the heat pipe, and a side of the housing facing the heat pipe is an open end;
an electric heating block, arranged at one side of an inner cavity of the housing far from the open end and used as a local heat source;
a framework, connected with an outer wall of the open end of the housing;
thermovoltaic power generation sheets, arranged at one side of the inner cavity of the housing close to the open end, and the thermovoltaic power generation sheets are located between the framework and the electric heating block; and
two hoops, respectively connected with two ends of the housing, and the hoops are sleeved on the heat pipe, and cross sections of the hoops are arranged in regular polygon structures and corresponding to an outer wall of the heat pipe, where a relative distance between the two hoops is adjusted according to a length of the housing.

Optionally, each of the hoops includes:
two half-hoops, combined to form the hoop, two ends of each of the half-hoops are respectively provided with matched clamping grooves and clamping blocks, the clamping grooves and the clamping blocks are tenoned, and holes used for connecting by bolts are formed on the clamping grooves and the clamping blocks;
where a groove is formed in a middle of any side of the half-hoop, and both ends of an outer wall of the half-hoop located at both sides of the groove are respectively provided with threaded holes.

Optionally, the open end of the housing protrudes outwards relative to the two ends of the housing, and the two ends of the housing are respectively provided with connecting holes adapted to the threaded holes; and the connecting holes and the threaded holes are connected by bolts.

Optionally, outer walls of the two ends of the housing are respectively provided with outlet holes for wires of the electric heating block to extend out, and the wires of the electric heating block pass through the groove.

Optionally, a side wall of the housing is provided with a plurality of small holes, used for a thermocouple to extend into space between the thermovoltaic power generation sheets and the electric heating block through the small holes.

Optionally, the thermocouple electrically connects collected temperature signals with a temperature collecting control system.

Optionally, two sides of the framework are respectively provided with a plurality of limiting holes, and the framework and the outer wall of the open end are connected by bolts through the limiting holes.

Optionally, a gap is left between the electric heating block and an inner wall of the housing for adding thermal insulation materials to reduce a heat loss of the electric heating block.

Optionally, both sides of the thermovoltaic power generation sheets are respectively provided with heat-conducting silica gel sheets.

An assembly method of a detachable geothermal in-situ thermovoltaic power generation module, including following steps:
installing heat-conducting silica gel sheets on the both sides of the thermovoltaic power generation sheets;
filling a bottom of the inner cavity of the housing with the thermal insulation materials;
sequentially placing the electric heating block and the thermovoltaic power generation sheets in the housing from the bottom of the inner cavity of the housing towards the open end, synchronously completing an installation of the thermocouple by connecting the framework and the housing, and completing an assembly of the thermovoltaic power generation module;
installing several hoops on the heat pipe, and adjusting a distance between two adjacent hoops according to the length of the housing; and
generating heat by the electric heating block after being electrified, electrically connecting the collected temperature signals with the temperature collecting control system by the thermocouple, and realizing accurate and stable temperature control of hot and cold ends of the thermovoltaic power generation module by using a PID temperature controller and a variable silicon voltage regulating module.

The disclosure discloses the following technical effects.

The heat pipe part is in the form of regular polygon, which makes the heat pipe more fitting with the thermovoltaic power generation module and increases the heat transfer area.

The thermovoltaic power generation part is integrated into an integrated thermovoltaic power generation unit module, so as to simplify the overall device composition and installation.

The arrangement position and overall length of the thermovoltaic power generation unit are more flexible and the installation and replacement are more convenient by using the hoop fixing method.

The length of the thermovoltaic power generation part may be changed conveniently by increasing the number of thermovoltaic power generation units.

A plurality of holes are prefabricated in the housing to facilitate the assembly between parts, and the whole thermovoltaic power generation units are more firm.

PID temperature controller and variable silicon voltage regulating module are used to control the temperature of the hot and cold sides of the thermovoltaic power generation sheets to realize accurate and stable temperature control.

The total power generation of the system is increased by superimposing the number of thermovoltaic power generation units, so as to build a kilowatt power generation system.

The thermovoltaic power generation units designed in this scheme may not only be used in the in-situ geothermal power generation system, but also be used in other thermoelectric power generation application scenarios such as industrial waste heat recovery.

BRIEF DESCRIPTION OF THE DRAWINGS

In order to explain the embodiments of the present disclosure or the technical scheme in the prior art more clearly, the drawings needed in the embodiments will be briefly introduced below. Obviously, the drawings described below are only some embodiments of the present disclosure, and other drawings may be obtained according to these drawings without creative work for ordinary people in the field.

DETAILED DESCRIPTION OF THE EMBODIMENTS

In the following, the technical scheme in the embodiment of the disclosure will be clearly and completely described with reference to the attached drawings. Obviously, the described embodiment is only a part of the embodiment of the disclosure, but not the whole embodiment. Based on the embodiments in the present disclosure, all other embodiments obtained by ordinary technicians in the field without creative labor belong to the scope of protection of the present disclosure.

In order to make the above objects, features and advantages of the present disclosure more obvious and easier to understand, the present disclosure will be further described in detail with the attached drawings and specific implementation methods.

Figure 1:
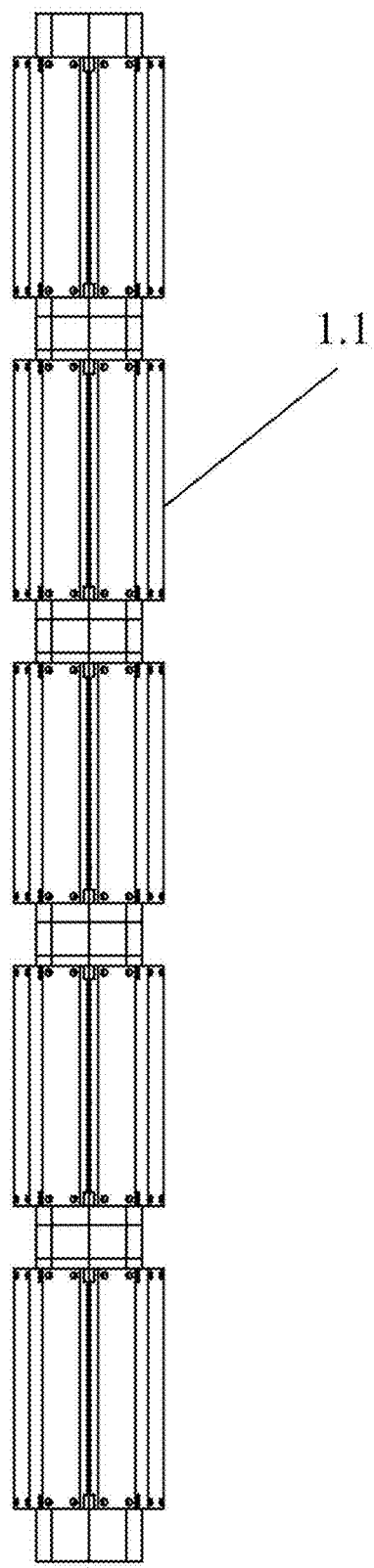
FIG. 1 is a structural schematic diagram of a detachable geothermal in-situ thermovoltaic power generation module and an assembly method.
Figure 2:
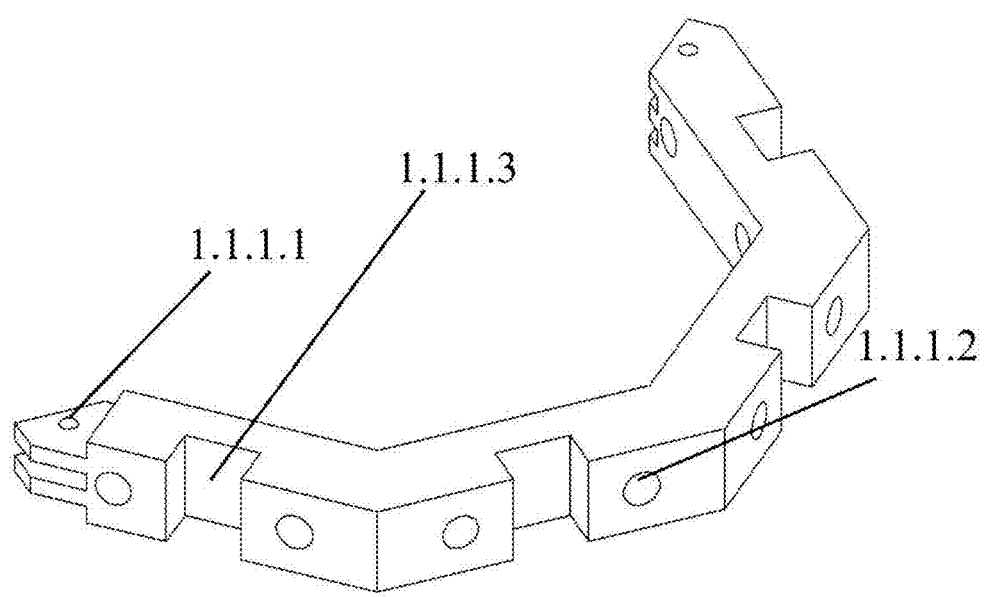
FIG. 2 is a schematic structural diagram of the hoop of the present disclosure.
Figure 3:
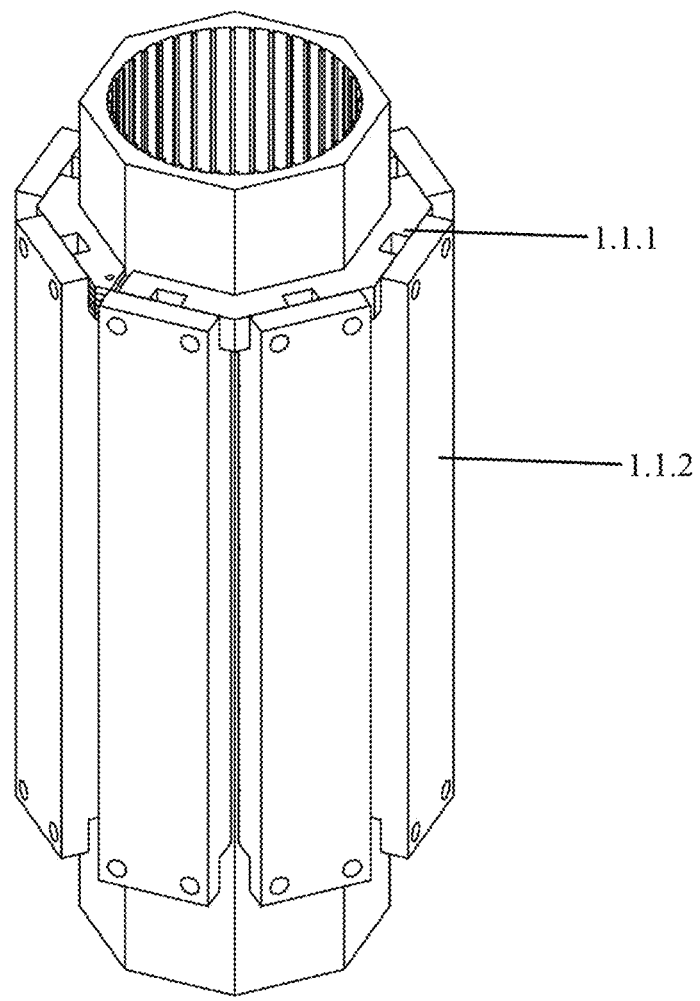
FIG. 3 is a schematic structural diagram of a thermovoltaic power generation unit in the present disclosure.
Figure 4:
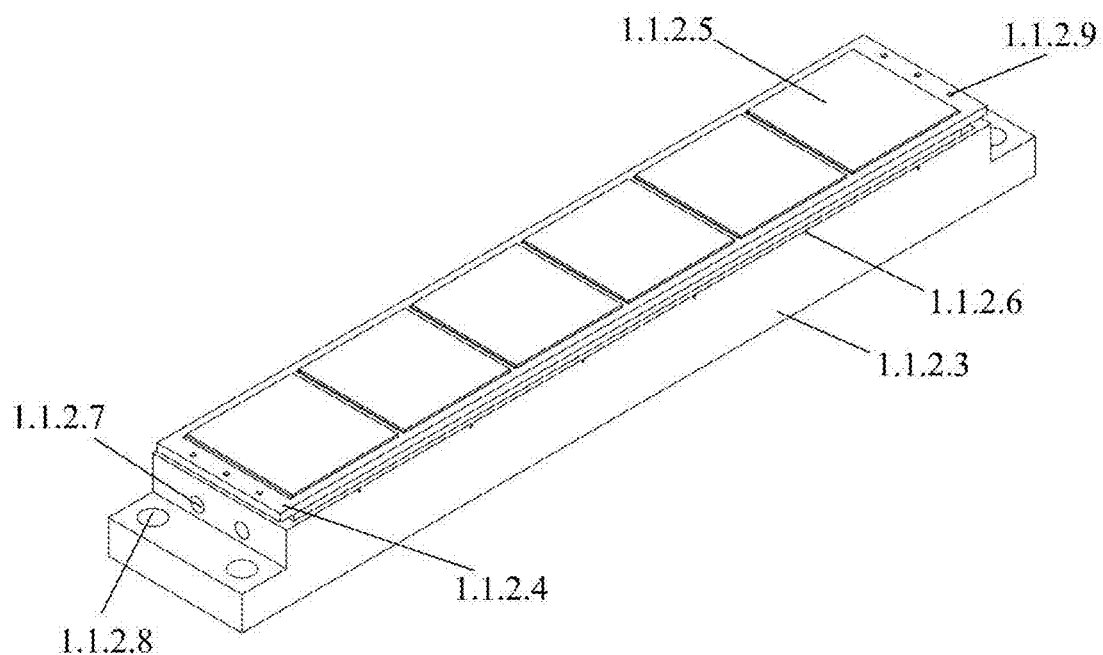
FIG. 4 is a schematic structural diagram of the thermovoltaic power generation module in the present disclosure.
Figure 5:
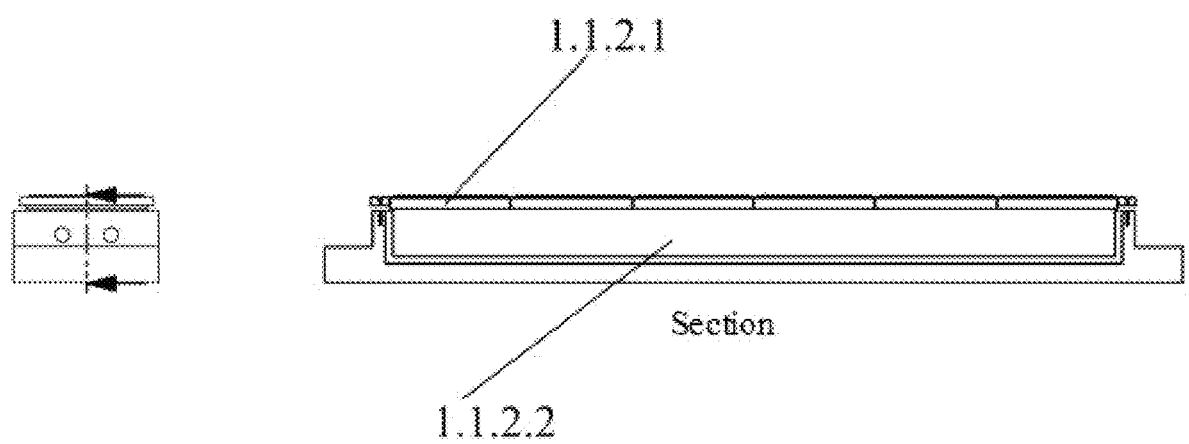
FIG. 5 is a sectional view of the thermovoltaic power generation module in the present disclosure.
Figure 6:
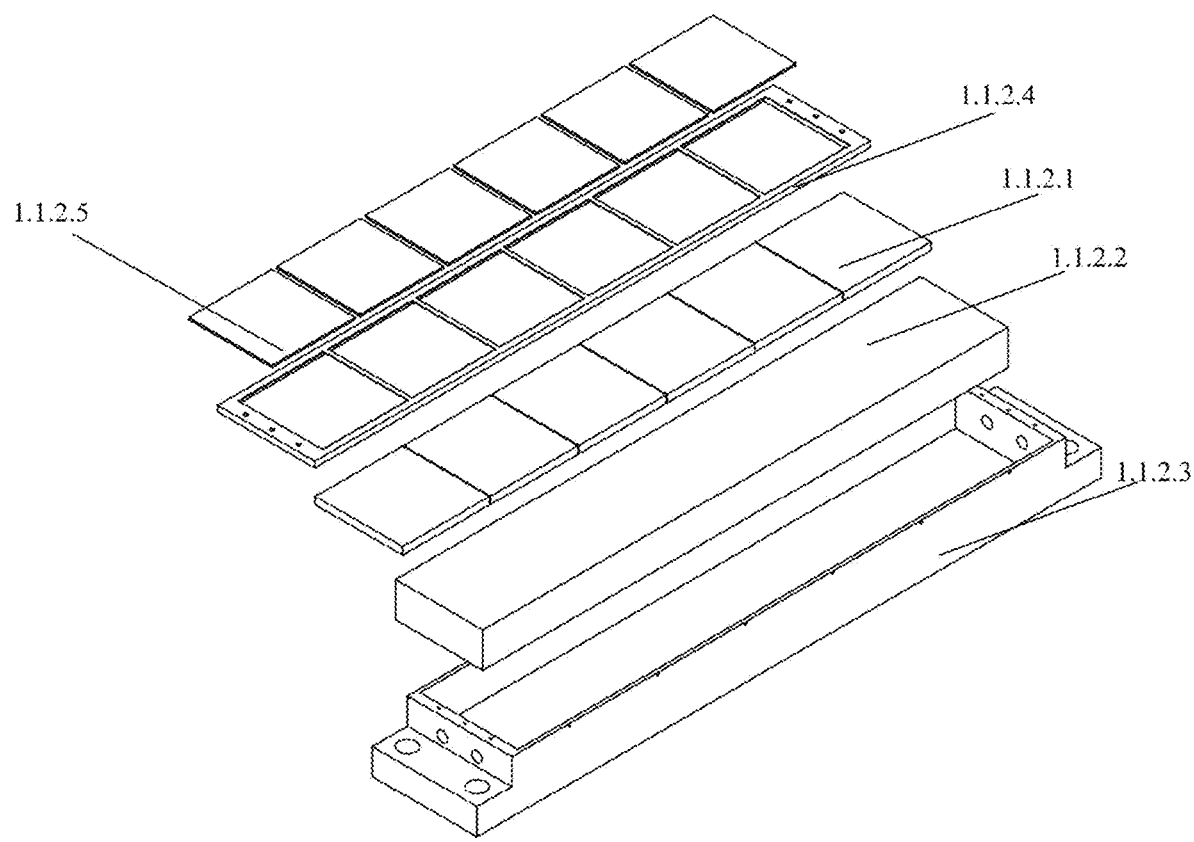
FIG. 6 is an explosion diagram of the thermovoltaic power generation module in the present disclosure.
Figure 7:
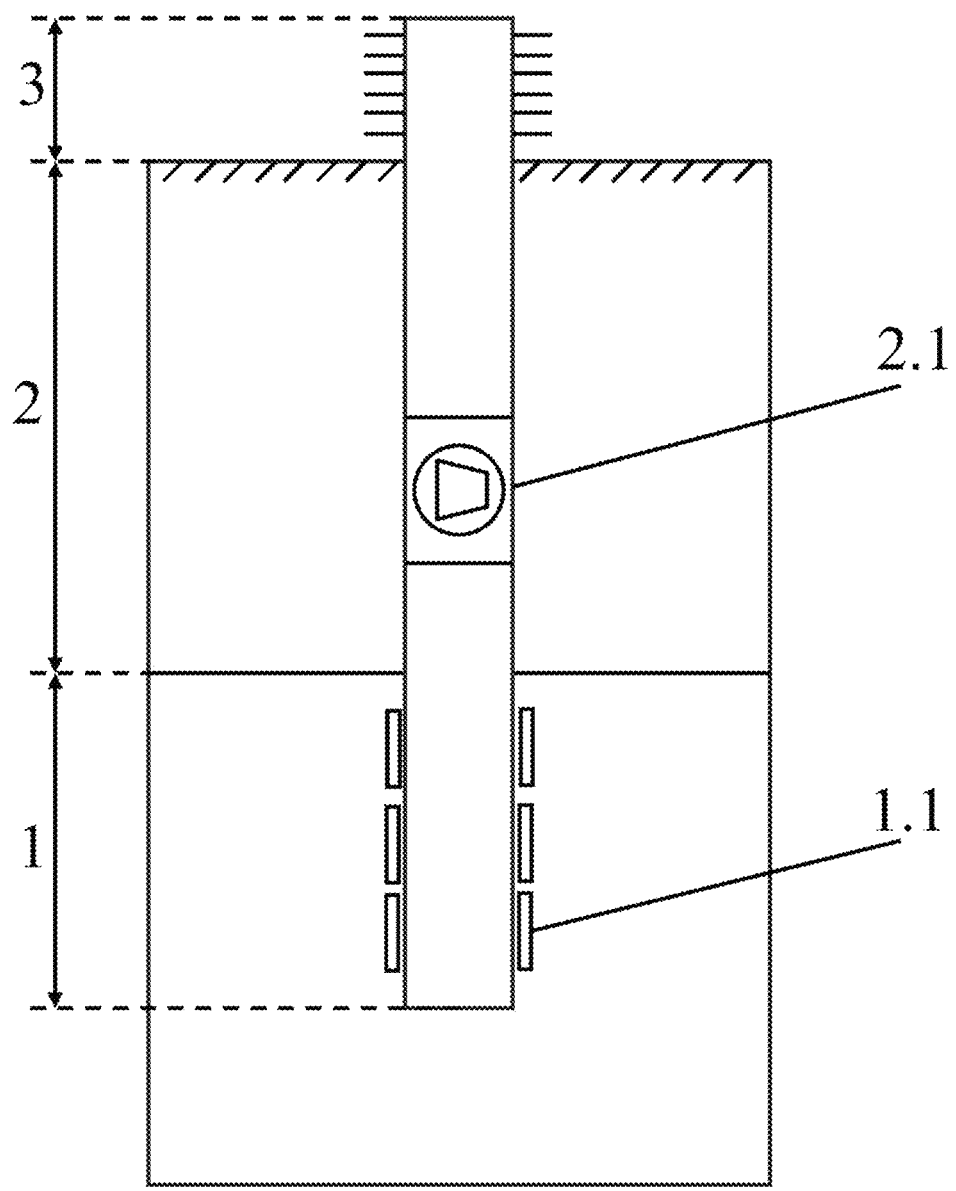
FIG. 7 is a schematic diagram of in-situ geothermal power generation.
Figure 8:
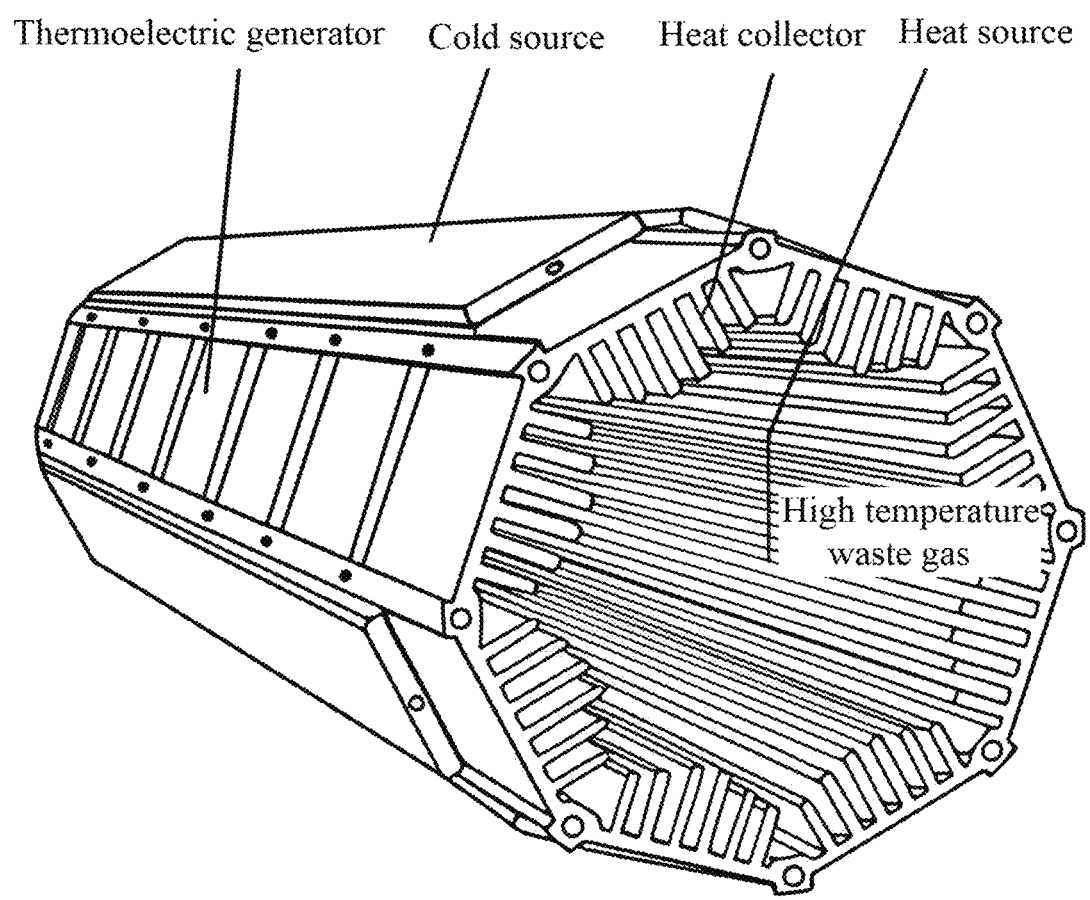
FIG. 8 is a structural schematic diagram of the prior art.
Figure 9:
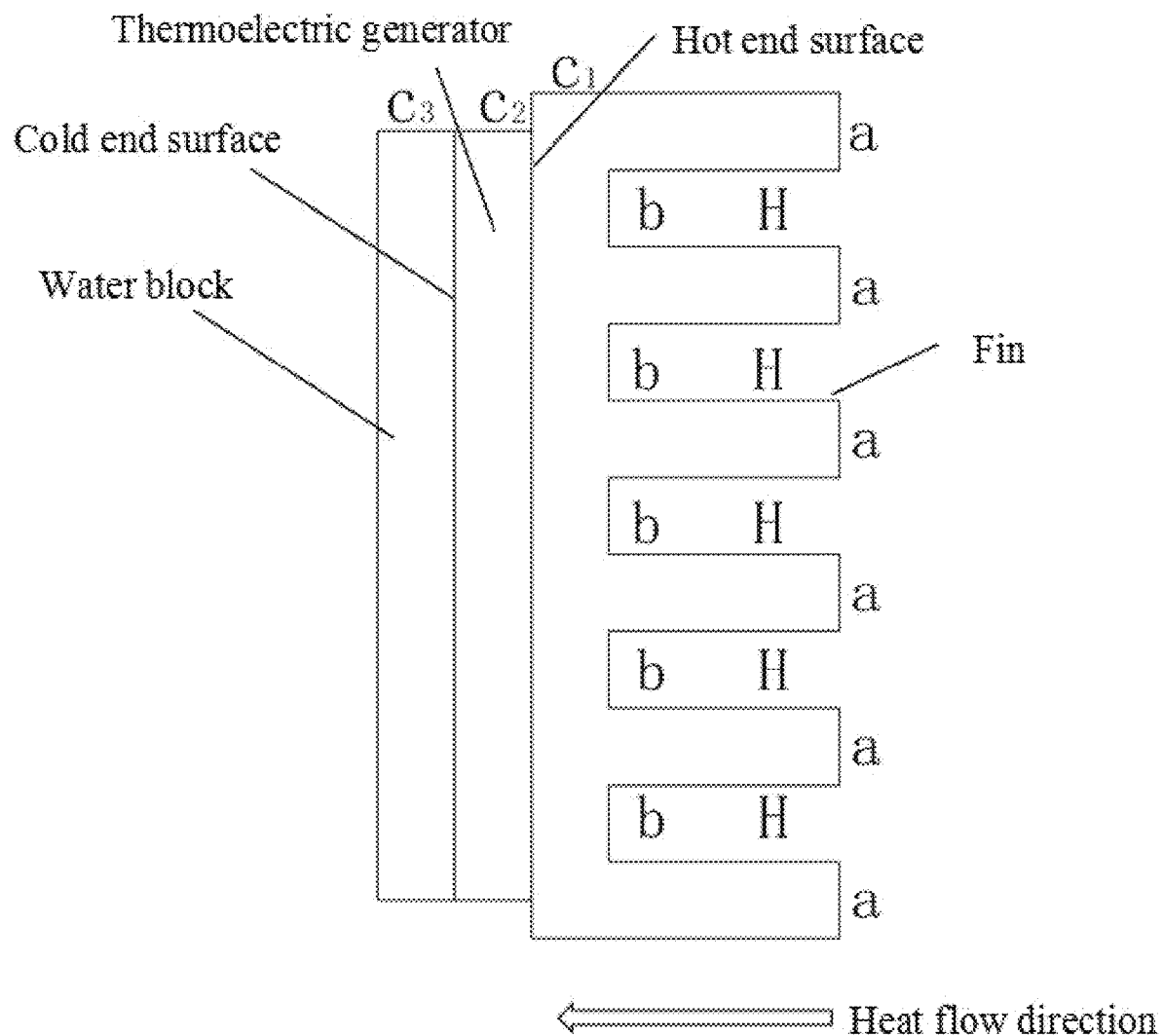
FIG. 9 is a schematic diagram of the prior art.

Referring to FIG. 7, the in-situ power generation device takes a heat pipe as the main body, and the heat pipe includes an evaporation section 1, an insulation section 2 and a condensing section 3. The outer wall of the evaporation section 1 of the heat pipe is fitting with the thermoelectric module, while the other side of the thermoelectric module is in contact with the heat source, thus generating electromotive force under the action of the temperature difference between the two sides. A magnetic suspension turbine generator 2.1 is installed in the middle of the insulation section 2 of the heat pipe, and the magnetic induction line is cut by the rotation of working medium steam to generate electricity. The condensing section 3 of the heat pipe is in contact with the cold source for heat exchange, so that the working medium vapor is condensed and refluxed, and the self-circulation of the working medium is realized. The technical scheme integrates the evaporation section 1, thermoelectric module and heat source into a modular unit, thus realizing the large-scale integration of power generation testing system.

Referring to FIG. 1-FIG. 6, the disclosure provides a detachable geothermal in-situ thermovoltaic power generation module, including:
- a heat pipe, with a cross section set as a regular polygon structure;
- a plurality of thermovoltaic power generation units 1.1 sleeved on the heat pipe at intervals and arranged in series;
- where each of the thermovoltaic power generation units 1.1 includes a plurality of thermovoltaic power generation modules 1.1.2, and a number of the plurality of thermovoltaic power generation units 1.1 corresponds to a number of sides of the heat pipe;
- each of the thermovoltaic power generation modules 1.1.2 includes:
  a housing 1.1.2.3, arranged at one side of the heat pipe, and a side of the housing 1.1.2.3 facing the heat pipe is an open end;
  an electric heating block 1.1.2.2, arranged at one side of an inner cavity of the housing 1.1.2.3 far from the open end and used as a local heat source;
  a framework 1.1.2.4, connected with an outer wall of the open end of the housing 1.1.2.3;
  thermovoltaic power generation sheets 1.1.2.1, arranged at one side of the inner cavity of the housing 1.1.2.3 close to the open end, and the thermovoltaic power generation sheets 1.1.2.1 are located between the framework 1.1.2.4 and the electric heating block 1.1.2.2; and
  two hoops, respectively connected with two ends of the housing 1.1.2.3, and the hoops are sleeved on the heat pipe, and cross sections of the hoops are arranged in regular polygon structures and corresponding to an outer wall of the heat pipe, where a relative distance between the two hoops is adjusted according to a length of the housing 1.1.2.3.

The intimate adaptation between the traditional circular heat pipe and the commonly used thermovoltaic power generation modules 1.1.2 is poor, the machining of the special heat pipe is difficult and there are potential safety hazards, and the degree of freedom of the traditional module fixing method is low. In this disclosure, the N-sided heat pipe is adopted to improve the intimate adaptation between the thermovoltaic power generation modules 1.1.2 and the heat pipe, and a new power generation unit structure and fixing method are adopted. Based on this, the disclosure modularizes the thermovoltaic power generation modules, combines a plurality of thermovoltaic power generation sheets 1.1.2.1 with the electric heating block 1.1.2.2 to form a thermovoltaic power generation module 1.1.2, and uses fastening hoops to fix N thermovoltaic power generation modules 1.1.2 on the heat pipe to form a thermovoltaic power generation unit 1.1. By adjusting the number of layers of the thermovoltaic power generation units 1.1, the modularization assembly of the in-situ power generation device and the variable length of the thermovoltaic power generation section may be realized, thus reducing the processing difficulty of the heat pipe, improving the safety and increasing the freedom of module arrangement.

In order to ensure that the thermovoltaic power generation units 1.1 may be fully fitting with the heat pipe and increase the heat transfer area, the heat pipe is designed as an external regular polygon structure (taking a regular octagon as an example). The length of the heat pipe fully meets the practical application requirements, and the connecting parts are reduced to prevent leakage and reduce potential safety hazards. The side length of the regular polygon outside the heat pipe matches the size of the thermovoltaic power generation module 1.1.2, and is slightly larger than the side length of the thermovoltaic power generation module 1.1.2. The main innovation of the disclosure is the evaporation section 1, which is installed on the surface of the heat pipe by the combination of the hoops and the thermovoltaic power generation units 1.1. By installing the multi-section thermovoltaic power generation units 1.1 on the heat pipe one by one, the length of the thermovoltaic power generation part may be freely changed, so as to adjust the total power generated by the system. By superposing the number of thermovoltaic power generation units 1.1, a kilowatt power generation system may be built.

Further optimizing the scheme, two half-hoops, combined to form the hoop, two ends of each of the half-hoops are respectively provided with matched clamping grooves and clamping blocks, the clamping grooves and the clamping blocks are tenoned, and holes 1.1.1.1 used for connecting by bolts are formed on the clamping grooves and the clamping blocks;

where a groove 1.1.1.3 is formed in a middle of any side of the half-hoop, and both ends of an outer wall of the half-hoop located at both sides of the groove 1.1.1.3 are respectively provided with threaded holes 1.1.1.2.

The N modules of the thermovoltaic power generation units 11 and the heat pipes are fixed together by hoops to form a whole. The two half-hoops form a complete hoop, and the two half-hoops are fastened together by means of tenon joint and bolt connection through the reserved clamping groove and holes 1.1.1.1, and clamped on the octagonal housing 1.1.2.3 of the heat pipe. Each side of the hoop is equipped with threaded holes 1.1.1.2 which are matched with the holes at the upper and lower ends of the housing 1.1.2.3, and the two may be tightly connected together through threaded connection. In addition, the middle of each side of the hoop is provided with a groove 1.1.1.3 through which the conductor of the electric heating block 1.1.2.2 passes. The method of fixing the thermovoltaic power generation module 1.1.2 with hoops may meet the requirements of fixing the thermovoltaic power generation modules 1.1.2 with different lengths, and the fixed position may be freely selected.

According to the further optimization scheme, the open end of the housing 1.1.2.3 protrudes outwards relative to the two ends of the housing 1.1.2.3, and the two ends of the housing 1.1.2.3 are respectively provided with connecting holes 1.1.2.8 adapted to the threaded holes 1.1.1.2, and the connecting holes 1.1.2.8 are connected with the threaded holes 1.1.1.2 by bolts.

According to the further optimization scheme, outer walls of the two ends of the housing 1.1.2.3 are respectively provided with outlet holes 1.1.2.7 for wires of the electric heating block 1.1.2.2 to extend out, and the wires of the electric heating block 1.1.2.2 pass through the groove 1.1.1.3.

According to the further optimization scheme, a side wall of the housing 1.1.2.3 is provided with a plurality of small holes 1.1.2.6, used for a thermocouple to extend into space between the thermovoltaic power generation sheets 1.1.2.1 and the electric heating block 1.1.2.2 through the small holes 1.1.2.6.

According to the further optimization scheme, the thermocouple electrically connects collected temperature signals with a temperature collecting control system.

The side wall of the housing 1.1.2.3 is provided with small holes 1.1.2.6 into which a thermocouple may be inserted, so that the thermocouple may be inserted between the thermovoltaic power generation sheets 1.1.2.1 and the electric heating block 1.1.2.2, and the thermocouple may be fixed. By connecting the signals collected by thermocouple with the temperature collecting control system, the precise and stable control of the temperature of the hot and cold ends of the thermovoltaic power generation module 1.1.2 is realized by using PID temperature controller and variable silicon voltage regulating module.

According to the further optimization scheme, two sides of the framework 1.1.2.4 are respectively provided with a plurality of limiting holes 1.1.2.9, and the framework 1.1.2.4 and the outer wall of the open end are connected by bolts through the limiting holes 1.1.2.9.

According to the further optimization scheme, a gap is left between the electric heating block 1.1.2.2 and an inner wall of the housing 1.1.2.3 for adding thermal insulation materials to reduce a heat loss of the electric heating block 1.1.2.2.

According to the further optimization scheme, both sides of the thermovoltaic power generation sheets 1.1.2.1 are respectively provided with heat-conducting silica gel sheets 1.1.2.5.

The thermovoltaic power generation module 1.1.2 is mainly composed of thermovoltaic power generation sheets 1.1.2.1, an electric heating block 1.1.2.2, a housing 1.1.2.3, a framework 1.1.2.4, and a heat-conducting silica gel sheets 1.1.2.5. According to the order from bottom to top, the housing 1.1.2.3, the electric heating block 1.1.2.2, the thermovoltaic power generation sheets 1.1.2.1 (the upper and lower sides of which are provided with heat-conducting silica gel sheets 1.1.2.5 to reduce the contact thermal resistance) and the framework 1.1.2.4 are assembled into a single thermovoltaic power generation module 1.1.2. The upper part of the housing 1.1.2.3 is provided with two outlet holes 1.1.2.7 for the extension of the wires of the electric heating block 1.1.2.2, and the upper and lower four connecting holes 1.1.28 are matched with the holes 1.1.1.1 on the hoop, and the housing 1.1.2.3 and the hoop are closely connected by means of threaded connection. The framework 1.1.2.4 is matched with the size of the thermovoltaic power generation sheets 1.1.2.1, so that the thermovoltaic power generation sheets 1.1.2.1 may be placed in the empty groove of the framework 1.1.2.4. limiting holes 1.1.2.9 are left at the upper and lower ends of the framework 1.1.2.4, which correspond to the threaded holes 1.1.1.2.3 on the housing, and the framework 1.1.2.4 is fixed on the housing 1.1.2.3 through threaded connection.

The disclosure relates to an assembly method of a detachable geothermal in-situ thermovoltaic power generation module, including the following steps:

installing heat-conducting silica gel sheets 1.1.2.5 on the both sides of the thermovoltaic power generation sheets 1.1.2.1;

filling a bottom of the inner cavity of the housing 1.1.2.3 with the thermal insulation materials;

sequentially placing the electric heating block 1.1.2.2 and the thermovoltaic power generation sheets 1.1.2.1 in the housing 1.1.2.3 from the bottom of the inner cavity of the housing 1.1.2.3 towards the open end, synchronously completing an installation of the thermocouple by connecting the framework 1.1.2.4 and the housing 1.1.2.4, and completing an assembly of the thermovoltaic power generation module 1.1.2;

installing several hoops on the heat pipe, and adjusting a distance between two adjacent hoops according to the length of the housing 1.1.2.3; and generating heat by the electric heating block 1.1.2.2 after being electrified, electrically connecting the collected temperature signals with the temperature collecting control system by the thermocouple, and realizing accurate and stable temperature control of hot and cold ends of the thermovoltaic power generation module 1.1.2 by using a PID temperature controller and a variable silicon voltage regulating module.

The directions or positional relationships indicated by "front", "back", "left", "right", "vertical", "horizontal", "top", "bottom", "inside" and "outside" are based on the directions or positional relationships shown in the attached drawings, and are only for the convenience of describing the present disclosure, and do not indicate or imply that the devices or elements referred to must have specific directions or positions.

The above embodiments only describe the preferred mode of the disclosure, and do not limit the scope of the disclosure. Under the premise of not departing from the design spirit of the disclosure, various modifications and improvements made by ordinary technicians in the field to the technical scheme of the disclosure shall fall within the protection scope determined by the claims of the disclosure.

What is claimed is:

1. A detachable geothermal in-situ thermovoltaic power generation module, comprising:
    a heat pipe, with a cross section set as a regular polygon structure;
    a plurality of thermovoltaic power generation units, sleeved on the heat pipe at intervals and arranged in series;
    wherein each of the thermovoltaic power generation units comprises a plurality of thermovoltaic power generation modules, and a number of the plurality of thermovoltaic power generation units corresponds to a number of sides of the heat pipe;
    each of the thermovoltaic power generation modules comprises:
        a housing, arranged at one side of the heat pipe, and a side of the housing facing the heat pipe is an open end;
        an electric heating block, arranged at one side of an inner cavity of the housing far from the open end and used as a local heat source;
        a framework, connected with an outer wall of the open end of the housing;
        thermovoltaic power generation sheets, arranged at one side of the inner cavity of the housing close to the open end, and the thermovoltaic power generation sheets are located between the framework and the electric heating block; and
        two hoops, respectively connected with two ends of the housing, and the hoops are sleeved on the heat pipe, and cross sections of the hoops are arranged in regular polygon structures and corresponding to an outer wall of the heat pipe, wherein a relative distance between the two hoops is adjusted according to a length of the housing;
    wherein each of the hoops comprises:
        two half-hoops, combined to form the hoop, two ends of each of the half-hoops are respectively provided with matched clamping grooves and clamping blocks, the clamping grooves and the clamping blocks are tenoned, and holes used for connecting by bolts are formed on the clamping grooves and the clamping blocks; and
        wherein a groove is formed in a middle of any side of each of the half-hoops, and both ends of an outer wall of each of the half-hoops located at both sides of the groove are respectively provided with threaded holes.

2. The detachable geothermal in-situ thermovoltaic power generation module according to claim 1, wherein:
    the open end of the housing protrudes outwards relative to the two ends of the housing, and the two ends of the housing are respectively provided with connecting holes adapted to the threaded holes; and the connecting holes and the threaded holes are connected by bolts.

3. The detachable geothermal in-situ thermovoltaic power generation module according to claim 2, wherein:
    outer walls of the two ends of the housing are respectively provided with outlet holes for wires of the electric heating block to extend out, and the wires of the electric heating block pass through the groove.

4. The detachable geothermal in-situ thermovoltaic power generation module according to claim 3, wherein:
    a side wall of the housing is provided with a plurality of small holes, used for a thermocouple to extend between the thermovoltaic power generation sheets and the electric heating block through the small holes.

5. The detachable geothermal in-situ thermovoltaic power generation module according to claim 4, wherein:
    the thermocouple electrically connects collected temperature signals with a temperature collecting control system.

6. The detachable geothermal in-situ thermovoltaic power generation module according to claim 5, wherein:
    two sides of the framework are respectively provided with a plurality of limiting holes, and the framework and the outer wall of the open end are connected by bolts through the limiting holes.

7. The detachable geothermal in-situ thermovoltaic power generation module according to claim 6, wherein:
    a gap is left between the electric heating block and an inner wall of the housing for adding thermal insulation materials to reduce a heat loss of the electric heating block.

8. The detachable geothermal in-situ thermovoltaic power generation module according to claim 7, wherein both sides of the thermovoltaic power generation sheets are respectively provided with heat-conducting silica gel sheets.

9. An assembly method of a detachable geothermal in-situ thermovoltaic power generation module, according to the detachable geothermal in-situ thermovoltaic power generation module of claim 8, comprising following steps:
    installing the heat-conducting silica gel sheets on the both sides of the thermovoltaic power generation sheets;
    filling a bottom of the inner cavity of the housing with the thermal insulation materials;
    sequentially placing the electric heating block and the thermovoltaic power generation sheets in the housing from the bottom of the inner cavity of the housing towards the open end, synchronously completing an installation of the thermocouple by connecting the framework and the housing, and completing an assembly of the thermovoltaic power generation modules;
    installing several hoops on the heat pipe, and adjusting a distance between two adjacent hoops according to the length of the housing; and
    generating heat by the electric heating block after being electrified, electrically connecting the collected temperature signals with the temperature collecting control system by the thermocouple, and realizing accurate and stable temperature control of hot and cold ends of the thermovoltaic power generation modules by using a PID temperature controller and a variable silicon voltage regulating module.

* * * * *